United States Patent
McGrath et al.

(10) Patent No.: US 7,373,629 B2
(45) Date of Patent: May 13, 2008

(54) DISTRIBUTED RELOCATABLE VOLTAGE REGULATOR

(75) Inventors: Donald T. McGrath, Fort Collins, CO (US); Scott C. Savage, Fort Collins, CO (US); Robert D. Waldron, Fort Collins, CO (US); Kenneth G. Richardson, Erie, CO (US)

(73) Assignee: LSI Logic Corporation, Milpitas, CA (US)

( * ) Notice: Subject to any disclaimer, the term of this patent is extended or adjusted under 35 U.S.C. 154(b) by 403 days.

(21) Appl. No.: 11/113,615

(22) Filed: Apr. 25, 2005

(65) Prior Publication Data

US 2006/0239052 A1    Oct. 26, 2006

(51) Int. Cl.
*G06F 17/50* (2006.01)
*G05F 1/40* (2006.01)

(52) U.S. Cl. ....................................................... 716/17
(58) Field of Classification Search ................. 363/144, 363/147; 257/734, 744, 777; 326/47, 63, 326/80, 101; 438/14, 15, 129; 716/17, 18
See application file for complete search history.

(56) References Cited

U.S. PATENT DOCUMENTS

| | | | |
|---|---|---|---|
| 5,126,599 A * | 6/1992 | Gobbi et al. | 326/47 |
| 6,864,716 B2 * | 3/2005 | Monzel et al. | 326/47 |
| 7,143,386 B2 * | 11/2006 | Brown | 716/17 |
| 7,235,880 B2 * | 6/2007 | Prokofiev | 257/734 |
| 7,247,879 B2 * | 7/2007 | Nishimura et al. | 257/50 |

* cited by examiner

*Primary Examiner*—Matthew V. Nguyen
(74) *Attorney, Agent, or Firm*—Christopher P. Maiorana PC

(57) ABSTRACT

An apparatus comprising an integrated circuit having (i) a number of regions each pre-diffused and configured to be metal-programmed and (ii) a plurality of pins configured to connect the integrated circuit to a socket. A logic portion may be implemented on the integrated circuit (i) configured to implement integrated circuit operations and (ii) having one or more I/O connections and one or more supply connections. A first group of the pre-diffused regions are metal-programmed and coupled to said I/O connections. A second group of the pre-diffused regions are metal-programmed and coupled to the supply connections.

20 Claims, 4 Drawing Sheets

DISTRIBUTED RELOCATABLE VOLTAGE REGULATOR

FIELD OF THE INVENTION

The present invention relates to an application specific integrated circuit design generally and, more particularly, to a method and/or apparatus for implementing a distributed relocatable voltage regulator.

BACKGROUND OF THE INVENTION

Referring to FIG. 1, a number of programmable logic devices (PLDs) are shown. A PLD can include field programmable gate arrays (FPGAs) 10 and platform (or structured) application specific integrated circuits (platform ASICs) 12. For performance reasons, FPGAs implementations run with a higher supply voltage (i.e., VDD1) than the ASIC (i.e., VDD2<VDD1) for a particular process node. Since the FPGA 10 runs with a higher voltage, applications using the FPGA 10 have higher power consumption and need better heat dissipation capabilities. Although the platform ASIC 12 can be configured to physically fit in the same socket as the FPGA 10, conventional ASICs are not normally "drop in"compatible due to the power supply voltage mismatch.

It would be desirable to implement a method and/or apparatus for distributed relocatable voltage regulators that allow replacement of an existing FPGA with a platform ASIC without implementing external parts or other board level modifications.

SUMMARY OF THE INVENTION

The present invention concerns an apparatus comprising an integrated circuit having (i) a number of regions each pre-diffused and configured to be metal-programmed and (ii) a plurality of pins configured to connect the integrated circuit to a socket. A logic portion may be implemented on the integrated circuit (i) configured to implement integrated circuit operations and (ii) having one or more I/O connections and one or more supply connections. A first group of the pre-diffused regions are metal-programmed and coupled to said I/O connections. A second group of the pre-diffused regions are metal-programmed and coupled to the supply connections.

The objects, features and advantages of the present invention include providing distributed relocatable voltage regulator that may (i) generate core power or a per pin basis, (ii) configured a selected number of pins as regulators, (iii) manage power dissipation, and/or (iv) facilitate power management in lower power designs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
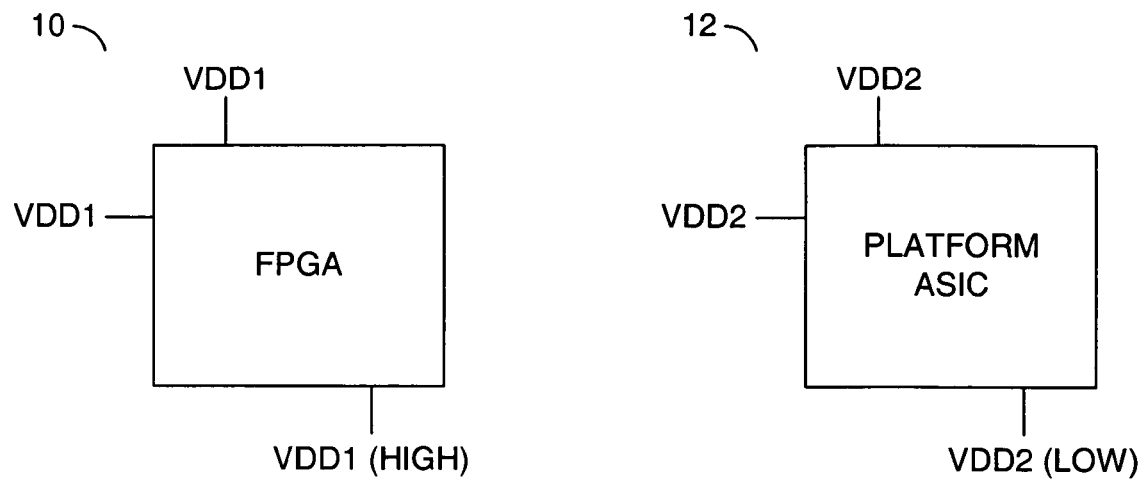
FIG. 1 is a block diagram illustrating example programmable logic chips.
Figure 2:
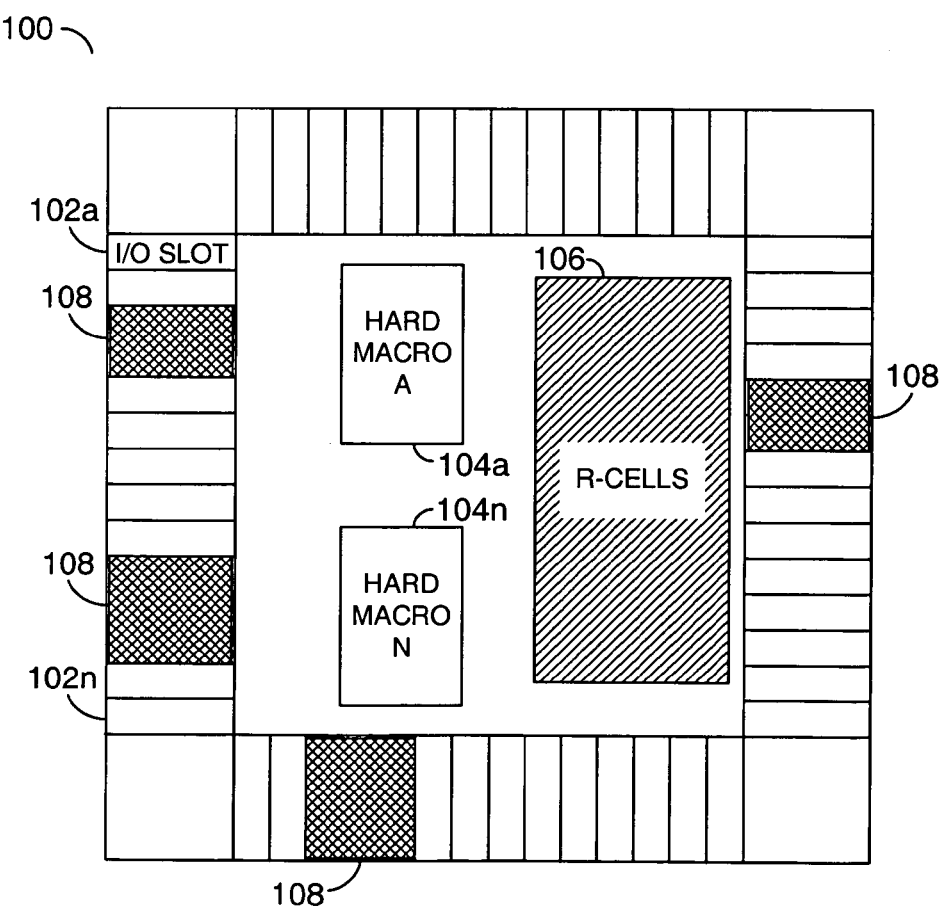
FIG. 2 is a block diagram illustrating a platform application specific integrated circuit in accordance with one or more preferred embodiments of the present invention.

Referring to FIG. 2, a block diagram of a programmable platform device (or die, or slice) 100 is shown in accordance with one or more preferred embodiments of the present invention. The slice 100 may be implemented, in one example, as a partially manufactured semiconductor device in which all of the silicon layers have been fabricated (e.g., a first processing or pre-inventory phase), but where customization may be performed at a later time (e.g., a second processing or post-inventory phase) via one or more metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice may be selected for customization at a later time because the particular IP blocks implemented are suitable for a customized application. By deferring the customization of the slice 100, a manufacturer may have the flexibility to keep an inventory of mostly complete slices 100 that may be used in a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

In one example, the slice 100 may comprise a number of regions 102, a number of regions 104, and one or more regions 106. The regions 102 may be implemented as configurable I/O slots (or CONFIGIOs) located around the periphery of the slice 100. The regions 104 may be implemented as one or more hard IP blocks (or hardmacros). The regions 106 may be implemented as one or more diffused regions. In one example, the diffused regions 106 may comprise an R-cell transistor fabric. The plurality of CONFIGIOs 102 may be distributed around a periphery of the slice 100. The regions 104 and 106 may be distributed around a core region of the slice 100.

In one example, the IP blocks 104 may be implemented similarly to an ASIC design. In general, the IP blocks 104 may be configured to provide a number of functions on the slice 100. For example, the IP blocks 104 may comprise phase locked loops (PLLs), instances of processors, input/output physical level (PHY) macros, etc. Soft and firm IP blocks may be implemented in the diffused region(s) 106.

The regions 106 may be customized, in one example, as logic and/or memory. For example, the regions 106 may be implemented as a sea of gates array. In one example, the regions 106 may be implemented as an R-cell transistor fabric comprising a number of R-cells. The term R-cell generally refers to an area of silicon designed (or diffused) to contain one or more transistors that have not yet been personalized (or configured) with metal layers. Wire layers may be added to the R-cells to make particular transistors, logic gates, soft and firm IP blocks and/or storage elements. For example, the programmable R-cells in the R-cell transistor fabric 106 may be customized to build non-diffused memories or other circuits for a particular application.

An R-cell generally comprises one or more diffusions for forming the parts of N and/or P type transistors and the contact points where wires may be attached in subsequent manufacturing steps (e.g., to power, ground, inputs and outputs). In general, the R-cells may be, in one example, building blocks for logic and/or storage elements. R-cells may be diffused in a regular pattern throughout a slice. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

Prior to customization, the regions 102 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors may be available (e.g., N and P, TO, ATO, HP, etc.). Examples of the types and numbers of devices that may be available in the regions 102 is summarized in the following TABLE 1:

TABLE 1

| ConfigIO2 | | ConfigIO1 | |
|---|---|---|---|
| Device Type | Number | Device Type | Number |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |

TABLE 1-continued

| ConfigIO2 | | ConfigIO1 | |
|---|---|---|---|
| Device Type | Number | Device Type | Number |
| nm_hp | 372 | | |
| nm_to | 1798 | | |
| resistors | 84 | | |

The devices provided in the regions 102 may be programmed by defining metal mask sets. Metal-metal capacitors (e.g., approximately one picofarad (pF) per slot) may be formed in the regions 102 where I/O power buses are absent. In one example, more than one of the regions 102 may be combined to implement more complex functions.

In one example, a multi-slot relocatable function 108 may be built using two or more metal mask sets. The metal mask sets may be placed over two or more of the generic prediffused regions 102 to form two or more sub-functions of the relocatable function 108. For any particular relocatable function 108, interconnects between the sub-functions may be implemented such that a place and route tool may be configured to run straight, orthogonal interconnections between the sub-functions. Straight, orthogonal interconnections generally minimize parasitics. The multi-slot functions in accordance with the present invention generally allow mixed-signal type or very sophisticated I/O functions to be defined and placed in the pre-defined, diffused I/O slots 102.

The multi-slot functions may be configured to provide mixed-signal functions using metal programmability. In general, the present invention allows mixed-signal functions to be constructed without any special diffused circuitry, special process options, and/or additional wafer cost. Because the mixed-signal functions implemented with multi-slot functions may be relocated to any I/O slot 102, pinout may be flexible. Examples of mixed-signal functions that may be implemented are summarized in the following TABLE 2:

TABLE 2

| Circuit | # of Slots | Applications | Function |
|---|---|---|---|
| PLL/DLL (500 MHZ range or less | 5-6 | Clock multipliers, clock-data deskew | Clock generation |
| Temperature Sensor (+/−10-15 degree C. accuracy) | 2-3 | Cabinet design, package selection verification, system testing, reliability verification | Provides digital output proportional to die temperature |
| Voltage regulator | 1-3 | Any product that employs dual voltages | Generates 1.2 V, 1.8 V, or 2.5 V supply from 2.5 V or 3.3 V supply. May use external pass device. |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20 Ksps Sigma-delta ADC | 1-3 | Circuit breakers, power meters, instrumentation, voice encoders, motor diagnostics, medical | Sensor interface (temperature, touchpanel, battery monitor, vibration, humidity, |

TABLE 2-continued

| Circuit | # of Slots | Applications | Function |
|---|---|---|---|
| | | devices, process controllers | position, other) |
| 8-bit, 10 Msps DAC | 2-3 | Motion control, process control, Tape/disc servos, digital trimming | Actuation and control |
| 32 Khz-50 Mhz Crystal Oscillator | 2 | Any application where a system clock is not always available: MP3 players, digital cameras, wireless devices, fish finders, featurized phones, circuit breakers | Generates a clock at a specified frequency set by the crystal |
| Filter (SC, CT) | 1-X | Tape read-channels, voice encoders, instrumentation, circuit breakers | Conditions as analog signals |

Other building block circuits that may be implemented to accomplish custom analog functions may include, but are not limited to, operational amplifiers, comparators, analog multiplexers, analog switches, voltage/current reference. The region 104 may also be used to implement mixed-signal functions (e.g., switched capacitor filters, gm/C filters, data converters, etc.).

Figure 3:
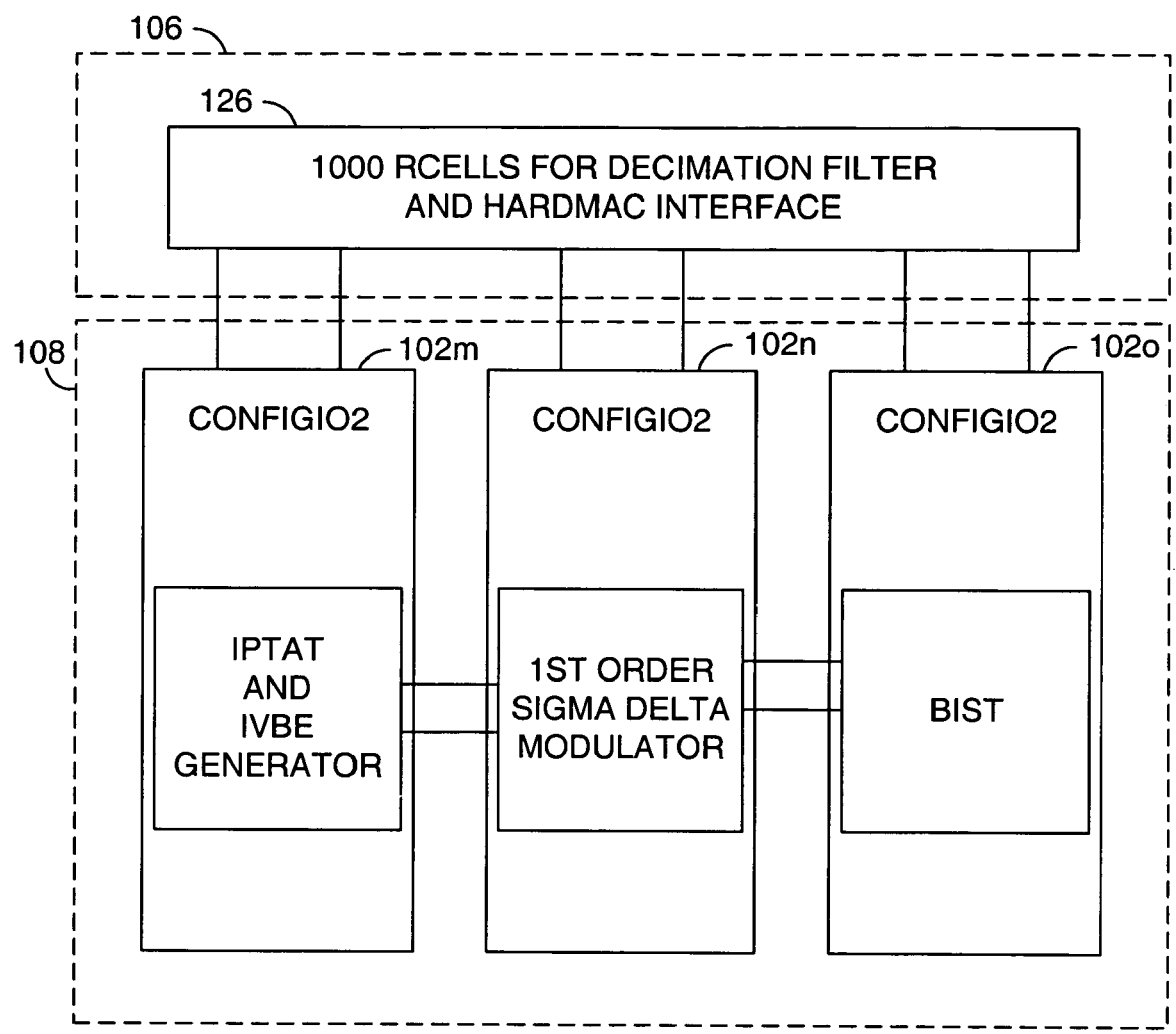
FIG. 3 is a block diagram illustrating a physical implementation of a temperature sensing circuit for a voltage regulator in accordance with a preferred embodiment of the present invention.

Referring to FIG. 3, a block diagram of the relocatable function 108 is shown in accordance with a preferred embodiment of the present invention. The term relocatable is used as a general term to indicate that the function may be located (or configured) in a number of locations around the slice 100. While the final result would be that the function 108 would be located in different locations, different pre-diffused regions would be used to implement the function 108 in the different locations. Also, one or more of the functions 108 may be implemented throughout the slots 102a-102n. The number of functions 108 may be varied to meet the design criteria of a particular implementation. The function 108 illustrates a temperature sensor implemented across multiple I/O slots 102m, 102n and 102o. The I/O slot 102m may be implemented as a IPTAT and IVBE generator. The I/O slot 102n may be implemented as a first order sigma delta modulator. The I/O slot 102o may be implemented as a built-in self test (BIST) circuit. The relocatable function 108 may be implemented to minimize supply bus overlap which may reduce power supply coupling.

In one example, a temperature sensor function may be implemented using a multi-slot relocatable function 108 implemented with three of the regions 102m, 102n and 102o, and a portion of the region 106. The sub-functions 102m, 102n, and 102o may be implemented with one or more metal mask sets configured to customize one or more respective regions 102 and/or a portion of the region 106.

In one example, the sub-function 102m may comprise a proportional to absolute temperature current (IPTAT) generator and a band-gap current (IVBE) generator. The sub-function 102n may comprise a first order sigma delta modulator. The sub-function 102o may comprise a built-in self test (BIST) circuit. The sub-function 126 may comprise a decimation filter and hardmac interface. The sub-function 126 may be implemented using a portion of the region 106 (e.g., using approximately 1,000 R-cells). In general, the layout of the sub-functions may be such that supply bus overlap is minimized. Minimizing supply bus overlap may reduce power supply coupling. The sub-functions 102m, 102n and 102o may be configured such that interconnections between the sub-functions may be run straight and orthogonal with respect to the sub-functions. For example, the interconnections may be aligned with a single axis (e.g., a horizontal axis) of the integrated circuit slice 100.

Figure 4:
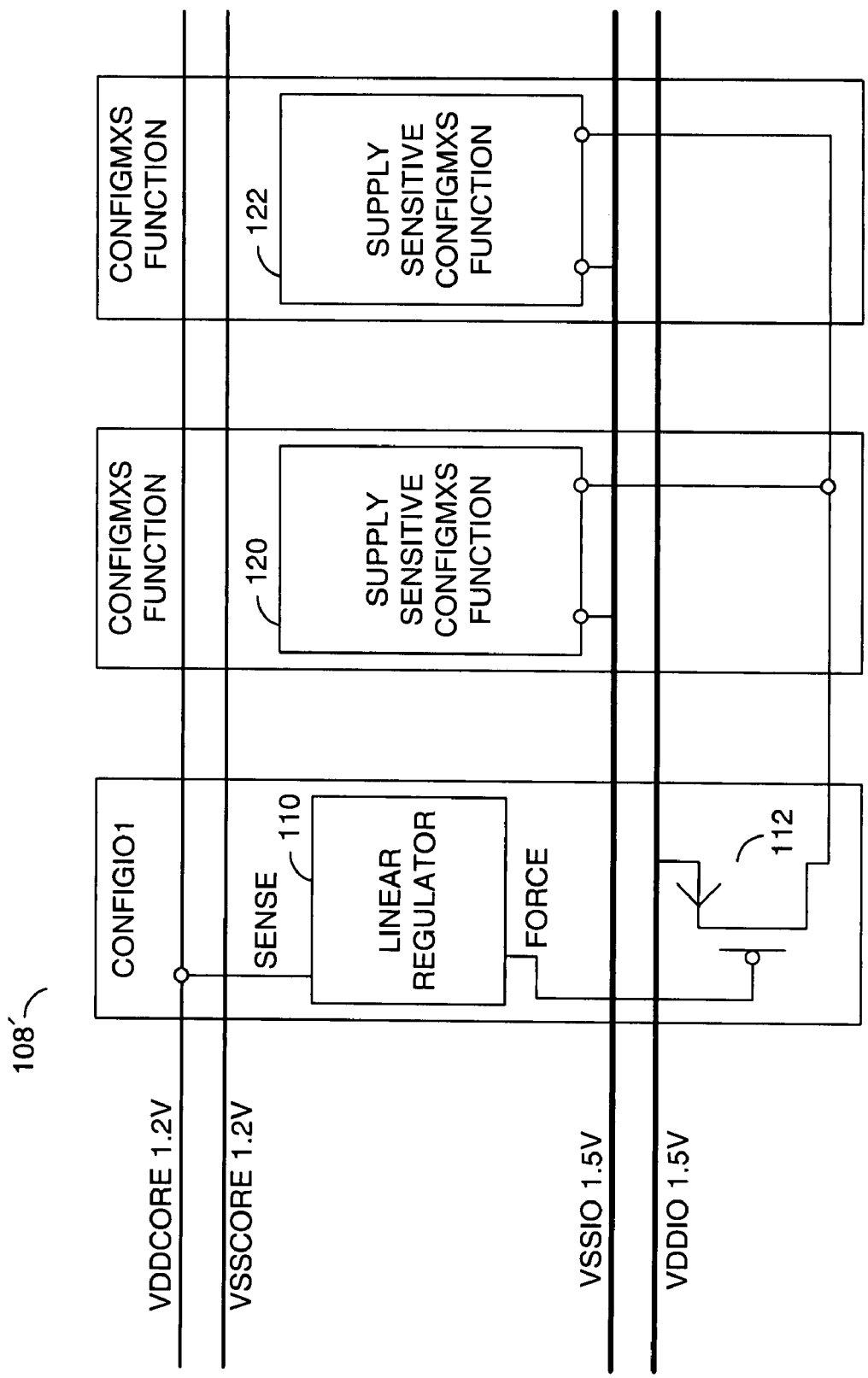
FIG. 4 is a block diagram of an implementation of a voltage regulator with an internal pass gate.

Referring to FIG. 4, a block diagram of a circuit 108' is shown illustrating a regulator 110 implemented in accordance with a preferred embodiment of the present invention. The regulator 110 receives a signal (e.g., SENSE) from the supply VDDCORE 1.2V. The regulator 110 presents a signal (e.g., FORCE) to a gate of a pass gate 112. The pass gate 112 also has a source connected to the signal VDDIO 1.5V. The pass gate 112 has a drain that is connected to a circuit 120 and a circuit 122. The circuit 120 may implement a supply sensitive configuration function. The circuit 122 may implement a supply sensitive configuration function. The circuit 120 and the circuit 122 may also receive an input from the virtual ground VSSIO 1.2V.

Figure 5:
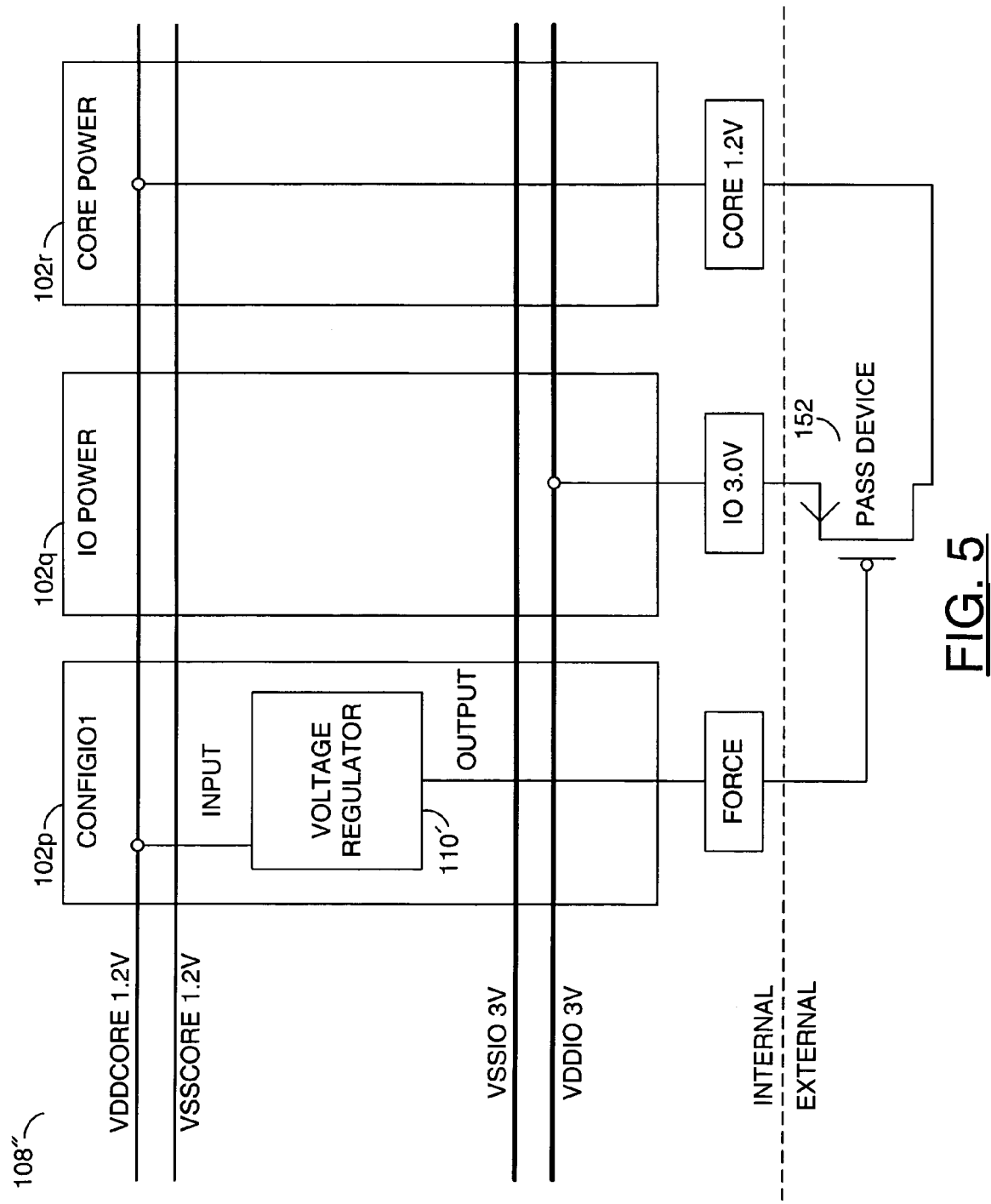
FIG. 5 is a block diagram of an implementation of a voltage regulator with an external pass gate.

Referring to FIG. 5 a block diagram of a circuit 108" is shown illustrating a voltage regulator 110' implemented in accordance with a preferred embodiment of the present invention. The voltage regulator 110' may be connected to a core voltage VDDCORE and a core virtual ground VSSCORE. The core VDDCORE and VSSCORE may be coupled to the voltage regulator 110'. Additionally, the voltage regulator 110' may be coupled to a second supply voltage VDDIO and a second ground VSSIO. The core voltage may be a 1.2V signal. The I/O voltage may be a 3V signal. However, other voltages may be implemented to meet the design criteria of a particular implementation.

The function 108" may be configured to implement the voltage regulator 110 using an off-chip pass device 152. The voltage regulator 110' using the off-chip pass device 152 may be implemented using three of the regions 102p, 102q and 102r. For example, the function 108' may comprise the regulator 110' (e.g., a linear regulator) implemented in a first region 102p. A second region 102q may be configured to present an external supply voltage (e.g., IO) to an internal I/O supply voltage bus (e.g., VDDIO). A third region 102r may be configured to present an external supply voltage (e.g., CORE) to an internal core voltage supply bus (e.g., VDDCORE).

An output from the first region 102p may be presented to a gate of an external pass device 152. In one example, the external pass device 152 may be implemented as one or more metal oxide semiconductor field effect transistors (MOSFETS). A source of the external pass device 152 may be connected to receive the supply voltage IO. A drain of the external pass device 152 may be connected to present the supply voltage CORE. The regulator 150 may have a signal (e.g., INPUT) that may be coupled to the internal core supply voltage bus and a signal (e.g., OUTPUT) that may be implemented as a control signal. A block (e.g., FORCE) may be coupled between a gate of the external pass device and the regulator 40. The block FORCE, the block IO 3.0V, and the block CORE 1.2V may be implemented as bond pads of an integrated circuit that are generally connected to package pins that go off chip. The regulator 110 may be configured to sense and control a voltage level of the internal core supply voltage bus using the external pass device. In one example, the multi-slot regulator function may be configured to generate a core voltage of 1.2 volts using an IO voltage supply of 3.0 volts. However, other voltage levels may be implemented to meet the design criteria of a particular implementation.

The present invention generally allows core power (e.g., 1.2V) to be generated at a lower voltage on a pin by pin basis to facilitate "same socket" retrofits. In one example, the voltage regulator 110 (or 110') may be integrated into all VDDCORE pins of a platform ASIC. In addition, a selected number of CONFIGIO slots may be configured as regulators. The combination of CONFIGIO and VDDCORE will provide a small controlled voltage drop. In a 0.13 micron technology, the voltage drop may be from 1.5V to about 1.2V. For 90 nm technology, the voltage drop may be from about 1.2V to 1V. The regulators 110a-110n may be distributed around the IO ring (e.g., around the periphery) to help manage power distribution and dissipation.

The present invention may allow a drop-in replacement into a socket where somewhat higher VDDCORE voltages are present. The present invention may be configured for VDD zone management of core power to facilitate power management in low power designs. No extra components are needed.

The present invention may be implemented without modification of board level components to allow replacement of FPGA devices. The present invention may use the area under the VDDCORE pin to limit the die area needed for implementation. The present invention may use prediffused IO slots for the same function. The configurability of the present invention implies that many transistors may be wired in different ways, such as the regulator 110 (or 110').

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    an integrated circuit having (i) a number of regions each pre-diffused and configured to be metal-programmed and (ii) a plurality of pins configured to connect said integrated circuit to a socket; and
    a logic portion implemented on said integrated circuit (i) configured to implement integrated circuit operations and (ii) having one or more I/O connections and one or more supply connections, wherein (i) a first group of said pre-diffused regions are metal-programmed and coupled to said I/O connections and (ii) a second group of said pre-diffused regions are metal-programmed coupled to said supply connections.

2. The apparatus according to claim 1, wherein said first and second groups of said pre-diffused regions are metal-programmed in different locations around a periphery of said integrated circuit in response to a particular configuration of said socket.

3. The apparatus according to claim 2, wherein said regions are pre-diffused during a first processing phase and configurable during a second processing phase.

4. The apparatus according to claim 3, wherein said first processing phase comprises a pre-inventory phase and said second processing phase comprises a post-inventory phase.

5. The apparatus according to claim 1, wherein one or more of said metal programmed regions comprise built-in self test circuits.

6. The apparatus according to claim 1, wherein one or more of said metal programmed regions comprise temperature compensation circuits.

7. The apparatus according to claim 1, wherein one or more of said metal programmed regions comprise first order delta sigma modulator circuits.

8. The apparatus according to claim 1, wherein one or more of said metal programmed regions comprise a Phase-Locked Loop (PLL).

9. The apparatus according to claim 1, wherein one or more of said metal programmed regions comprise a voltage regulator.

10. The apparatus according to claim 1, wherein a third group of said pre-diffused regions are not programmed.

11. An apparatus comprising:
    means for implementing an integrated circuit having (i) a number of regions each pre-diffused and configured to be metal-programmed and (ii) a plurality of pins configured to connect said integrated circuit to a socket;
    means for implementing integrated circuit operations on said integrated circuit; and
    means for implementing one or more I/O connections and one or more supply connections on said integrated circuit, wherein (i) a first group of said pre-diffused regions are metal-programmed and coupled to said I/O connections and (ii) a second group of said pre-diffused regions are metal-programmed coupled to said supply connections.

12. A method for configuring an integrated circuit comprising the steps of:
    (A) implementing an integrated circuit having (i) a number of regions each pre-diffused and configured to be metal-programmed and (ii) a plurality of pins configured to connect said integrated circuit to a socket; and
    (B) implementing a logic portion on said integrated circuit (i) configured to implement integrated circuit operations and (ii) having one or more I/O connections and one or more supply connections, wherein (i) a first group of said pre-diffused regions are metal-programmed and coupled to said I/O connections and (ii) a second group of said pre-diffused regions are metal-programmed coupled to said supply connections.

13. The apparatus according to claim 1, wherein a voltage regulator is integrated into each core voltage supply pin of said integrated circuit.

14. The apparatus according to claim 13, wherein the voltage regulators integrated into each core voltage supply pin of said integrated circuit are configured such that said integrated circuit is a drop-in replacement for a device having a higher core operating voltage.

15. The apparatus according to claim 14, wherein said integrated circuit comprises a platform application specific integrated circuit (ASIC) and said device having a higher core operating voltage comprises a field programmable gate array (FPGA).

16. The apparatus according to claim 2, wherein a number of pre-diffused regions distributed around the periphery of said integrated circuit are metal-programmed as voltage regulators to manage power distribution and dissipation.

17. The apparatus according to claim 9, wherein said voltage regulator is configured to control an external pass device.

18. The apparatus according to claim 17, wherein said external pass device comprises one or more metal oxide semiconductor field effect transistors (MOSFETS).

19. The apparatus according to claim 18, wherein a source of the external pass device is connected to receive an input/output (I/O) supply voltage and a drain of the external pass device presents a core supply voltage to said integrated circuit.

20. The apparatus according to claim 19, wherein the external pass device presents the core supply voltage to one or more supply sensitive function blocks of said integrated circuit.

* * * * *